US006915121B2

(12) United States Patent
Python et al.

(10) Patent No.: US 6,915,121 B2
(45) Date of Patent: Jul. 5, 2005

(54) INTEGRATED TUNABLE FILTER FOR BROADBAND TUNER

(75) Inventors: Dominique Python, Sunnyvale, CA (US); Pierre Favrat, Sunnyvale, CA (US); Didier Margairaz, Saratoga, CA (US); Alain-Serge Porret, Sunnyvale, CA (US)

(73) Assignee: Xceive Corporation, Santa Clara, CA (US)

( * ) Notice: Subject to any disclaimer, the term of this patent is extended or adjusted under 35 U.S.C. 154(b) by 491 days.

(21) Appl. No.: 10/236,604

(22) Filed: Sep. 6, 2002

(65) Prior Publication Data

US 2004/0063415 A1 Apr. 1, 2004

Related U.S. Application Data

(60) Provisional application No. 60/322,550, filed on Sep. 17, 2001.

(51) Int. Cl.[7] .............................. H04B 1/06; H04B 7/00; H03K 5/00
(52) U.S. Cl. ...................... 455/266; 455/340; 327/553
(58) Field of Search ................................. 455/266, 339, 455/340, 307; 327/335, 552, 553, 557, 558, 559; 333/165, 167

(56) References Cited

U.S. PATENT DOCUMENTS

| 4,363,135 | A |   | 12/1982 | Moon .......................... 455/180 |
| 4,843,343 | A | * | 6/1989  | Pace ........................... 330/257 |
| 5,293,514 | A | * | 3/1994  | Nakagawara ................. 327/65 |
| 5,752,179 | A |   | 5/1998  | Dobrovolny ................. 455/266 |

OTHER PUBLICATIONS

Randall L. Geiger and Edgar Sanchez–Sinencio, "Active Filter Design Using Operational Transconductance Amplifiers: A Tutorial," 8192 IEEE Circuits and Devices Magazine 1(1985) Mar., No. 2, pp. 20–32.

E. Sanchez–Sinencio and J. Silva–Martinez, "CMOS Transconductance Amplifiers, Architectures and Active Filters: A Tutorial," IEE Proc.–Circuits Devices Syst., vol. 147, No. 1, Feb. 2000, pp. 3–12.

International Search Report including written opinion, 11 pages.

* cited by examiner

*Primary Examiner*—Nguyen T. Vo
(74) *Attorney, Agent, or Firm*—Patent Law Group LLP; Carmen C. Cook

(57) ABSTRACT

A tunable filter circuit includes a first differential pair biased by a first current, a second differential pair biased by a second current, a first capacitor and a second capacitor. The tunable filter circuit of the present invention can be configured as a bandpass filter or a bandstop filter by connecting the input voltage signal to different input nodes of the tunable filter circuit. The tunable filter circuit can be tuned by adjusting the values of the first current and the second current. In an alternate embodiment, frequency tuning is achieved either by switching capacitive loads or changing resistive impedances introduced at the emitter of the differential pairs, which also extends the input voltage range of the filter. This emitter resistance is implemented using MOS switches whose on-resistance can be controlled for a precise tuning within a large frequency range.

40 Claims, 8 Drawing Sheets

INTEGRATED TUNABLE FILTER FOR BROADBAND TUNER

CROSS-REFERENCE TO RELATED APPLICATION

The present application claims the benefit of U.S. Provisional Patent Application No. 60/322,550, filed Sep. 17, 2001, and entitled "Integrated Tunable Filter For Broadband Tuner", which application is incorporated herein by reference in its entirety.

FIELD OF THE INVENTION

The present invention relates to a controlled tuning system for television receivers, and in particular, the present invention relates to tunable filters which can be incorporated in a tuner circuit for all VHF and UHF channels, including those channels having the frequencies in the low VHF band, the VHF and the UHF band.

DESCRIPTION OF THE RELATED ART

Television signals are transmitted in allocated radio frequency bands. In the United States, the low-VHF band extends between 54 to 88 MHz, the VHF band extends from 120 to 216 MHz and UHF band extends up to 1 GHz. Conventional television receivers employ a tuner to tune or select the desired radio frequency (RF) signals in a given frequency range (6 MHz) to the exclusion of all other signals in order to receive the desired channel.

FIG. 1 is an example of a conventional tuning system which can be used for the reception of low VHF, VHF and UHF broadcast channels. Referring to FIG. 1, the input RF signal on the input terminal 1 can be received from terrestrial broadcast or cable transmissions. The input RF signal is coupled to RF input circuits including a bandpass filter 2, a bandstop filter 3 (also known as a "trap or notch filter"), and a RF amplifier 4 whose gain could be externally controlled. The output of the amplifier 4 is connected to a tuner circuit 8, which is typically an integrated circuit. Tuner 8 may include one or more mixers, denoted by a mixer 5, and one or more variable local oscillators, denoted by variable oscillator 6. A tuning frequencies control system 7 in IC tuner 8 generates controlling signals for tuning the operation frequency of bandpass filter 2, bandstop filter 3 and variable local oscillator 6 to receive and to select the desired channel.

Conventional tuners, such as the tuner represented in FIG. 1, typically use discrete components to construct the RF input circuits, such as the filters. The discrete components include varactors (variable capacitance diode), inductors, capacitors and/or switchable diodes. For instance, switchable diodes are used to switch between the several allocated frequency bands. The varactors components perform a fine tuning operation for selecting a precise frequency operation within the selected frequency band. The remaining tuner components, such as the mixer and oscillator circuits, are manufactured on an integrated circuit component, apart from the filters in the tuner.

The filters can be integrated with the remaining tuner circuitry using active transistors-based circuits. A common way to realize high-order active filters is to cascasde biquadratic filter sections (also referred to as biquad filters). Typically, biquad filters are constructed using coupled pairs of transistors and capacitors. The frequency tuning is carried out by varying the current of the coupled pair. One of the disadvantages of active biquad filters is that their dynamic range is limited as compared to passive structures. Typically, for coupled pairs of bipolar transistors, the input voltage range is inferior to $2V_T$, where $V_T$ is about 26 mV at 300° K. and is technology independent. Examples of tuning systems for television receivers can be found in U.S. Pat. Nos. 4,363,135 and 5,752,179.

It is desirable to provide a tuner with integrated filters. It is also desirable to provide filters for use in tuners that are capable of receiving an extended input voltage range.

SUMMARY OF THE INVENTION

According to one embodiment of the present invention, a tunable filter circuit includes a first differential pair and a second differential pair. The first differential pair has a first input terminal coupled to a first node, a second input terminal coupled to a second node, and an output terminal coupled to a first current source. The first differential pair is biased by a second current source. The second differential pair has a first input terminal coupled to the output terminal of the first differential pair, a second input terminal coupled to the second node, and an output terminal coupled to a third current source and providing an output voltage signal. The second differential pair is biased by a fourth current source. The circuit further includes a first capacitor coupled between a third node and the output terminal of the first differential pair and a second capacitor coupled between the first node and the output terminal of the second differential pair.

The tunable filter circuit of the present invention can be configured as a bandpass filter by connecting the input voltage signal to the third node and connecting the first node to a first supply voltage, such as ground. Alternately, the tunable filter circuit of the present invention can be configured as a bandstop filter by connecting the input voltage signal to the first node and connecting the third node to the first supply voltage, such as ground.

In one embodiment, the tunable filter circuit of the present invention is tuned by adjusting the current values in the first, second, third and fourth current sources.

In another embodiment, the first and second differential pairs of the tunable filter circuit are implemented as bipolar emitter-coupled pairs. In yet another embodiment, a variable resistive element is introduced at the emitter terminals of each of the bipolar transistors in the first and second differential pairs. The variable resistive elements introduce emitter resistance at the differential pairs, effectively extending the input voltage range of the tunable filter circuit.

In yet another embodiment, the tunable filter circuit further includes a coarse tuning system for selecting between different frequency bands of interest. The coarse tuning system includes a first bank of capacitors each capacitor serially connected to a respective one of a first bank of switches. Each group of the serially connected capacitors and switches is connected between the third node and the output terminal of the first differential pair. The coarse tuning system further includes a second bank of capacitors each capacitor serially connected to a respective one of a second bank of switches. Each group of the serially connected capacitors and switches is connected between the first node and the output terminal of the second differential pair. The first and second banks of switches are controlled by corresponding control signals to selectively connect one or more of the first bank of capacitors in parallel with the first capacitor and to selectively connect one or more of the second bank of capacitors in parallel with the second capacitor.

According to another embodiment of the present invention, emitter resistance is introduced at each differential pair through a bank of transistor pairs. Each of the transistor pairs is controlled by a control signal for selectively turning on the respective transistor pairs. As a result, a stepwise increase or decrease in the resistive load at the emitter terminals of the differential pairs is realized. Furthermore, the voltage value of the control signal can be varied precisely to introduce precise but small variations in resistance.

Thus, in one embodiment, coarse tuning of the tunable filter circuit is effectuated by switching of capacitance and switching of resistance. Accordingly, the first and second banks of capacitors are selectively connected and the banks of transistor pairs are selectively engaged for selecting a desired frequency band. On the other hand, fine tuning of the tunable filter circuit is effectuated by adjusting precisely the voltage value of the control signal controlling each transistor pair in the bank of transistor pairs.

The present invention is better understood upon consideration of the detailed description below and the accompanying drawings.

DETAILED DESCRIPTION OF THE PREFERRED EMBODIMENTS

In accordance with the principles of the present invention, a tunable biquad filter for use in a tuner for low VHF, VHF and UHF reception is described. The tunable biquad filter includes two differential pairs biased by a first and a second current source respectively. The filter can be tuned by adjusting the values of the currents through the first and second current sources. The tunable biquad filter of the present invention can be readily integrated into an integrated circuit, enabling the construction of a fully integrated tuner. By obviating the use of discrete components, the size of a tuner thus constructed can be minimized and the manufacturing cost thereof can be reduced. In one embodiment, the tunable biquad filter is constructed so as to provide an extended input voltage range as compared to filters using conventional bipolar emitter-coupled pairs. When incorporated in a tuner system, the tunable biquad filter of the present invention can provide improved tuning performance.

Figure 1:
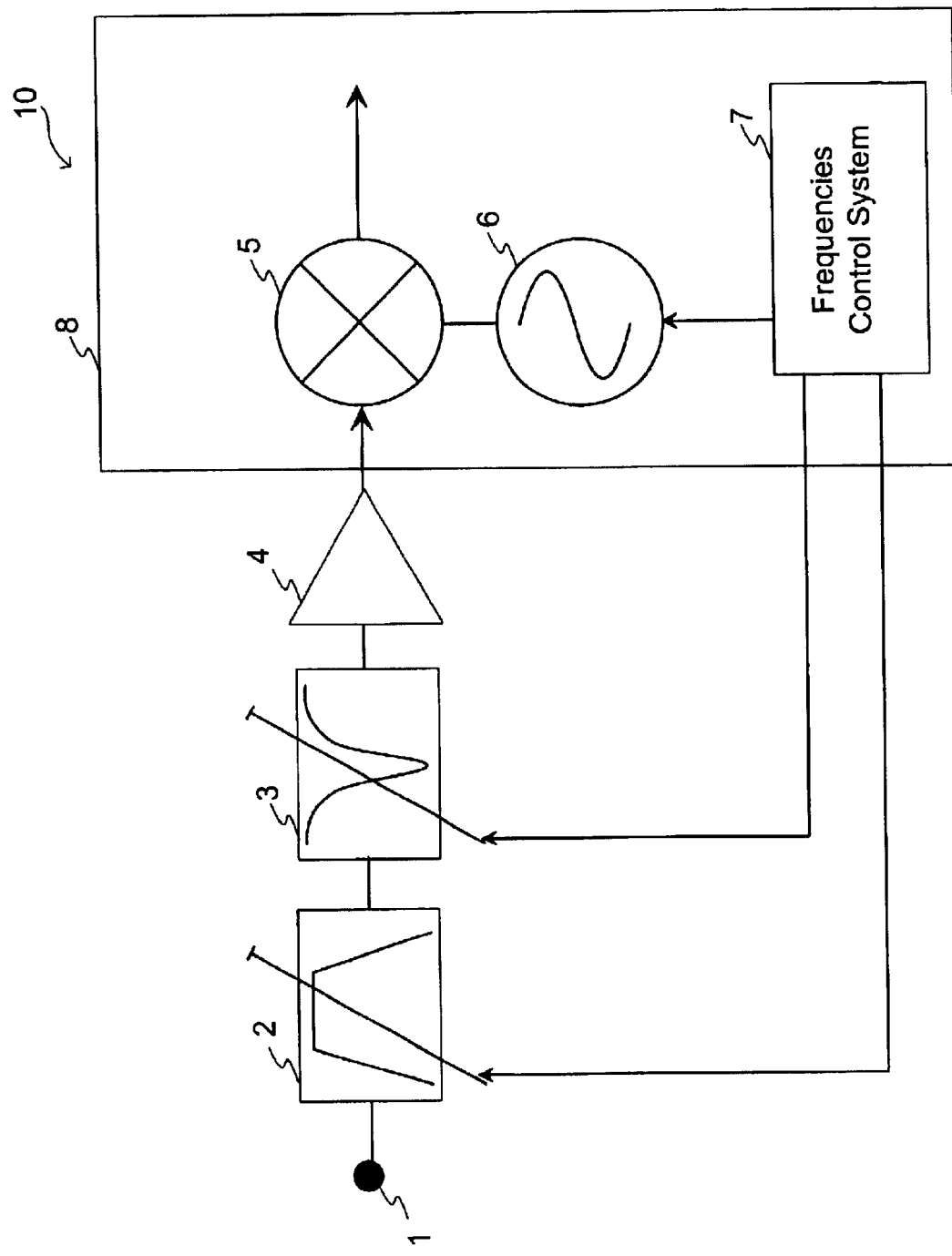
FIG. 1 shows a conventional tuning system for the reception of low VHF, VHF and UHF broadcast channels.
Figure 2:
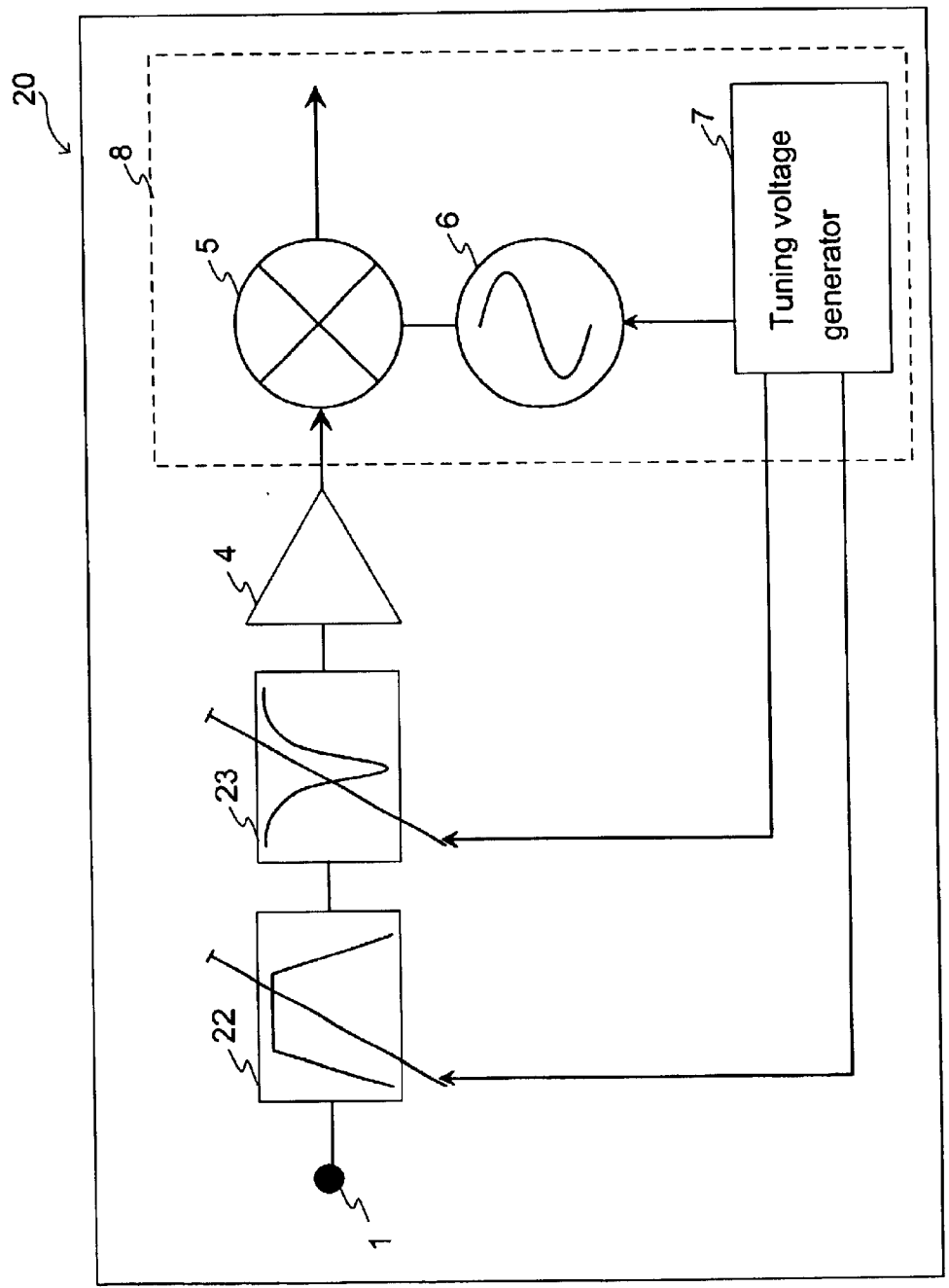
FIG. 2 is a block diagram of a tuner circuit in which the integrated tunable filter of the present invention can be practiced.

FIG. 2 is a block diagram of a tuner circuit in which the integrated tunable filter of the present invention can be practiced. Like elements in FIGS. 1 and 2 are provided with like reference numerals for ease of discussion. Referring to FIG. 2, a tuner 20 includes a RF input circuit and a tuning circuit 8. The RF input circuit includes a bandpass filter 22 and bandstop filter 23 constructed using the tunable biquad filter in accordance with the present invention. Accordingly, tuner 20 can integrate bandpass filter 22 and bandstop filter 23 onto the same integrated circuit as tuning circuit 8, improving the performance of the tuner and reducing the manufacturing cost. Note that the configuration of tuner 20 shown in FIG. 2 is illustrative only and one of ordinary skill in the art would appreciate that the tunable biquad filters of the present invention can be incorporated into tuners having any configurations to provide RF filtering functions.

Another advantage of the tunable biquad filter of the present invention is the adaptability of the basic filter circuit. That is, the basic tunable biquad filter circuit can be readily configured to provide the desired filter shape and functions as a bandpass filter or a bandstop filter. Specifically, the basic tunable biquad filter is reconfigured by coupling the input RF signal to different input nodes of the filter circuit, resulting in a different transfer function. The details of the biquad filter circuit of the present invention will be explained in more detail below with reference to FIGS. 3 to 6.

Figure 3:
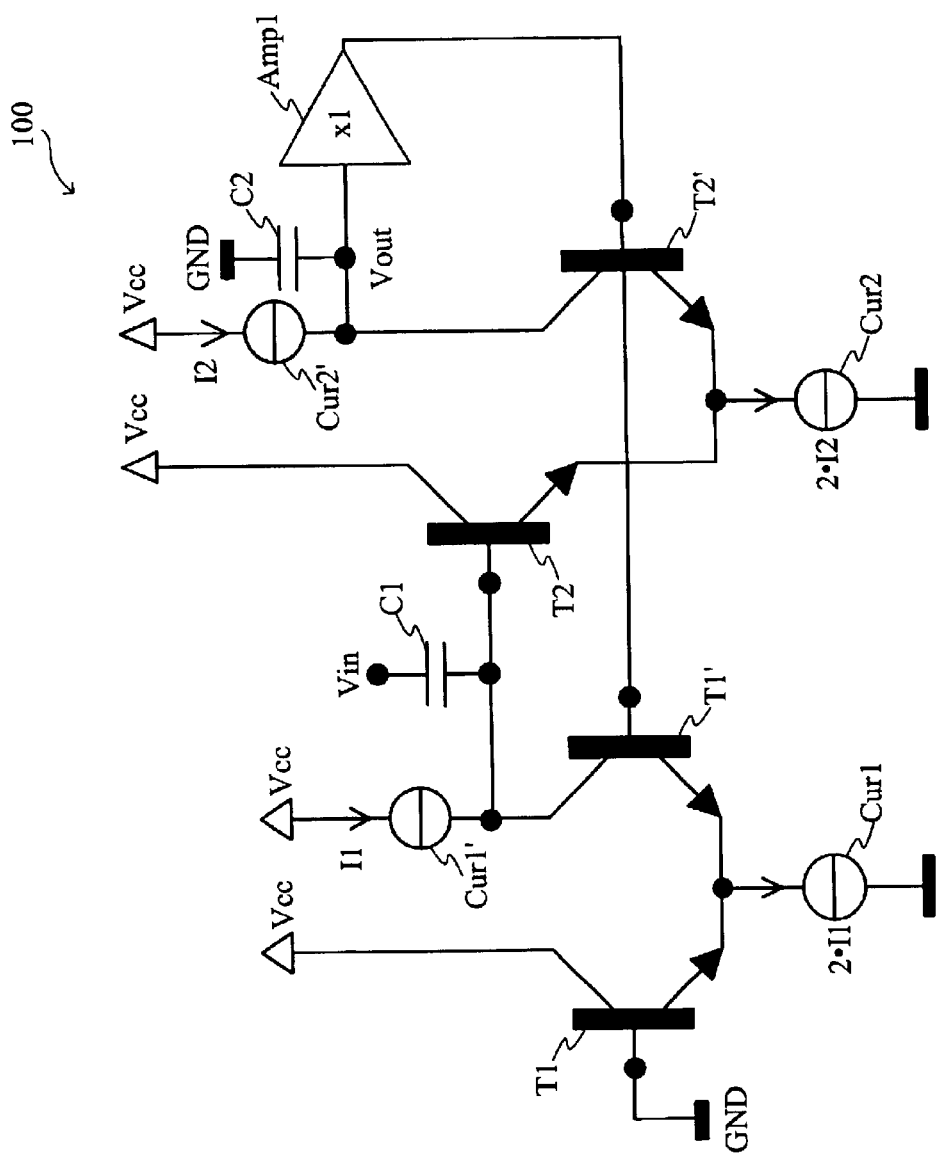
FIG. 3 is a circuit diagram of a bandpass biquad filter in a single-ended topology according to one embodiment of the present invention.

FIG. 3 is a circuit diagram of a biquad filter configured as a bandpass filter in a single-ended topology according to one embodiment of the present invention. Referring to FIG. 3, bandpass biquad filter 100 (bandpass filter 100) includes two emitter-coupled pairs. The first emitter-coupled pair is made up of bipolar transistors T1 and T1' and the second emitter-coupled pair is made up of bipolar transistors T2 and T2'.

In the first emitter-coupled pair, the collector terminal of transistor T1 is connected to Vcc which is the power supply voltage for the filter circuit. The collector terminal of transistor T1' is connected to a current source Cur1', delivering a current of value I1. The emitter terminals of transistors T1 and T1' are connected together and are connected to a current source Cur1 which current source delivering a current equal to 2•I1. The base terminal of transistor T1 is connected to an analogue ground voltage.

In the second emitter-coupled pair, the collector terminal of transistor T2 is connected to the Vcc voltage. The collector terminal of transistor T2' is connected to a current source Cur2', delivering a current of value I2. The emitter terminals of transistors T2 and T2' are connected together and are connected to a current source Cur2 which current source delivering a current equal to 2•I2. The base terminal of transistor T2 is connected to the collector terminal of transistor T1' and is also connected to a capacitor C1. The other plate of capacitor C1 is coupled to receive the input RF signal Vin. The base terminals of transistors T1' and T2' are connected together. The collector of T2' is connected to a capacitor C2, whose other plate is connected to the ground voltage. In general, the capacitance of capacitors C1 and C2 are not the same and are selected based on the equations given below.

Finally, a unity gain amplifier Amp1 or follower may be connected across the collector terminal and the base terminal of transistor T2'. The output signal Vout at the collector terminal of transistor T2' is the same Vout signal that appears at the output terminal of amplifier Amp1. As the differential pair has a high input impedance, amplifier Amp can be equivalently replaced by a wire. Amplifier Amp1 is not required for the operation of the filter circuit but rather is included when the filter circuit is interconnected with other circuit blocks. Amplifier Amp1 buffers the output signal Vout and prevents the subsequent circuit blocks from interfering with the operation of the filter circuit.

The relationship between the output signal Vout and the input signal Vin, also called the "transfer function", of bandpass filter 100 is given as:

$$H(s) = \frac{Vout}{Vin} = \frac{s \cdot \omega 2}{s^2 + s \cdot \omega 2 + \omega 1 \cdot \omega 2}, \text{ where}$$

$$\omega 1 = \frac{I1/U_T}{2 \cdot C1}; \text{ and}$$

$$\omega 2 = \frac{I2/U_T}{2 \cdot C2},$$

where $U_T$ is the thermodynamic potential approximately equal to 26 mV at 300° K., s is the Laplace variable and equals to jω for a pure sine wave signal.

The center frequency ($f_0$) of bandpass filter 100 and the 3-dB bandwidth (B) are given by the following equations:

$$f_0 = \frac{\sqrt{\omega 1 \cdot \omega 2}}{2 \cdot \pi} \text{ (in Hz); and}$$

$$B = \frac{\omega 2}{2 \cdot \pi} \text{ (in Hz)}$$

As shown by the preceding equations, the center frequency and the 3-dB bandwidth of bandpass filter 100 are tunable by adjusting the currents I1 and I2 of the filter circuit.

Figure 4:
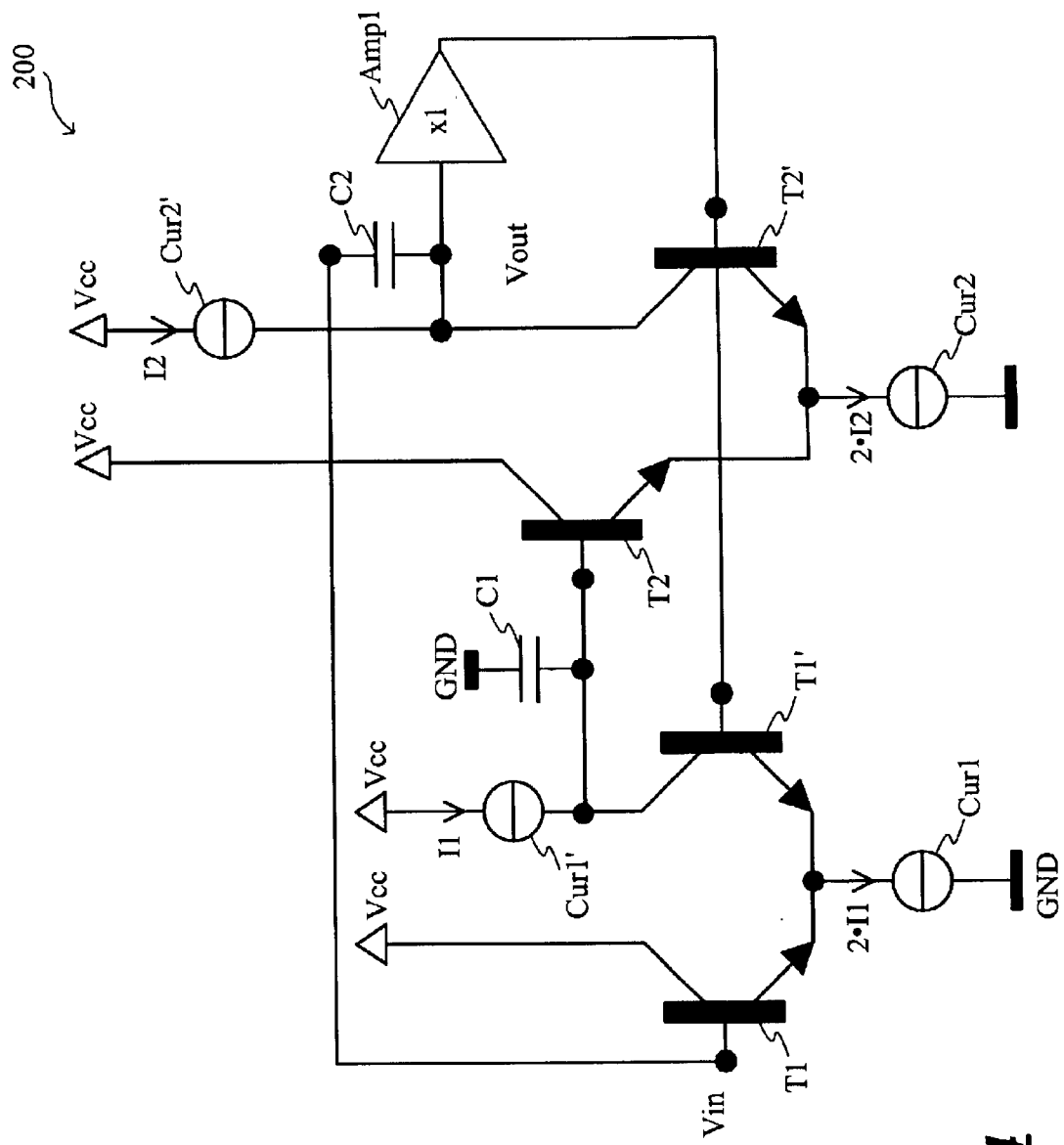
FIG. 4 is a circuit diagram of a bandstop biquad filter in a single-ended topology according to one embodiment of the present invention.

FIG. 4 is a circuit diagram of a biquad filter configured as a bandstop filter in a single-ended topology according to one embodiment of the present invention. A bandstop filter is also referred to as a "trap or notch filter." Like elements in FIGS. 3 and 4 are given like reference numerals to simplify the discussion. As can be seem by a comparison of FIGS. 3 and 4, the basic biquad filter circuit of two emitter-coupled pairs is used to provide different filter shape, and thereby different filter functions, by coupling the input RF signal to different nodes of the filter circuit.

Referring to FIG. 4, bandstop filter 200 includes two emitter-coupled pair connected in the same manner as that of bandpass filter 100 of FIG. 3. Specifically, the first emitter-coupled pair is made up of bipolar transistors T1 and T1'. The collector terminal of transistor T1 is connected to the power supply voltage Vcc and the collector terminal of transistor T1' is connected to a current source Cur1', delivering a current of value I1. The emitter terminals of transistors T1 and T1' are connected together and connected to a current source Cur1 which current source delivering a current equal to 2•I1. To configure the basic biquad filter circuit as a bandstop filter, the base terminal of transistor T1 is coupled to receive the input RF signal Vin.

In the second emitter-coupled pair including bipolar transistors T2 and T2', the collector terminal of transistor T2 is connected to the power supply voltage Vcc and the collector terminal of transistor T2' is connected to a current source Cur2', delivering a current of value I2. The emitter terminals of transistors T2 and T2' are connected together and are connected to a current source Cur2 which current source delivering a current equal to 2•I2. The base terminal of transistor T2 is connected to the collector terminal of transistor T1' and is also connected to a capacitor C1. In bandstop filter 200, the other plate of capacitor C1 is connected to the ground (GND) voltage. The base terminals of transistors T1 and T2' are connected together. The collector terminal of transistor T2' is connected to a capacitor C2. In the bandstop filter configuration, the other plate of capacitor C2 is connected to the input signal Vin. An amplifier Amp1 having a gain 1 (a unity gain amplifier) is coupled across the collector terminal and the base terminal of transistor T2'. The output signal Vout is both provided at the collector terminal of transistor T2' and the output of amplifier Amp1. As described above, amplifier Amp1 is optional, but inclusion of the amplifier achieves advantageously a low impedance at the filter output.

The relationship between the output signal Vout and the input RF signal Vin (the "transfer function") of bandstop filter 200 is given as follows:

$$H(s) = \frac{Vout}{Vin} = \frac{s^2 + \omega 1 \cdot \omega 2}{s^2 + s \cdot \omega 2 + \omega 1 \cdot \omega 2}, \text{ where}$$

$$\omega 1 = \frac{I1/U_T}{2 \cdot C1}; \text{ and}$$

$$\omega 2 = \frac{I2/U_T}{2 \cdot C2}, \text{ where}$$

$U_T$ is the thermodynamic potential, approximately equal to 26 mV at 300° K., s is the Laplace variable and equals to jω for a pure sine wave signal.

The center frequency ($f_0$) of bandstop filter 200 and the 3-dB bandwidth (B) are given by the following equations:

$$f_0 = \frac{\sqrt{\omega 1 \cdot \omega 2}}{2 \cdot \pi} \text{ (in Hz)}$$

$$B = \frac{\omega 2}{2 \cdot \pi} \text{ (in Hz)}$$

The above equations show that the center frequency $f_0$ and the 3-dB bandwidth of bandstop filter 200 are tunable by adjusting the values of currents I1 and I2.

Figure 5:
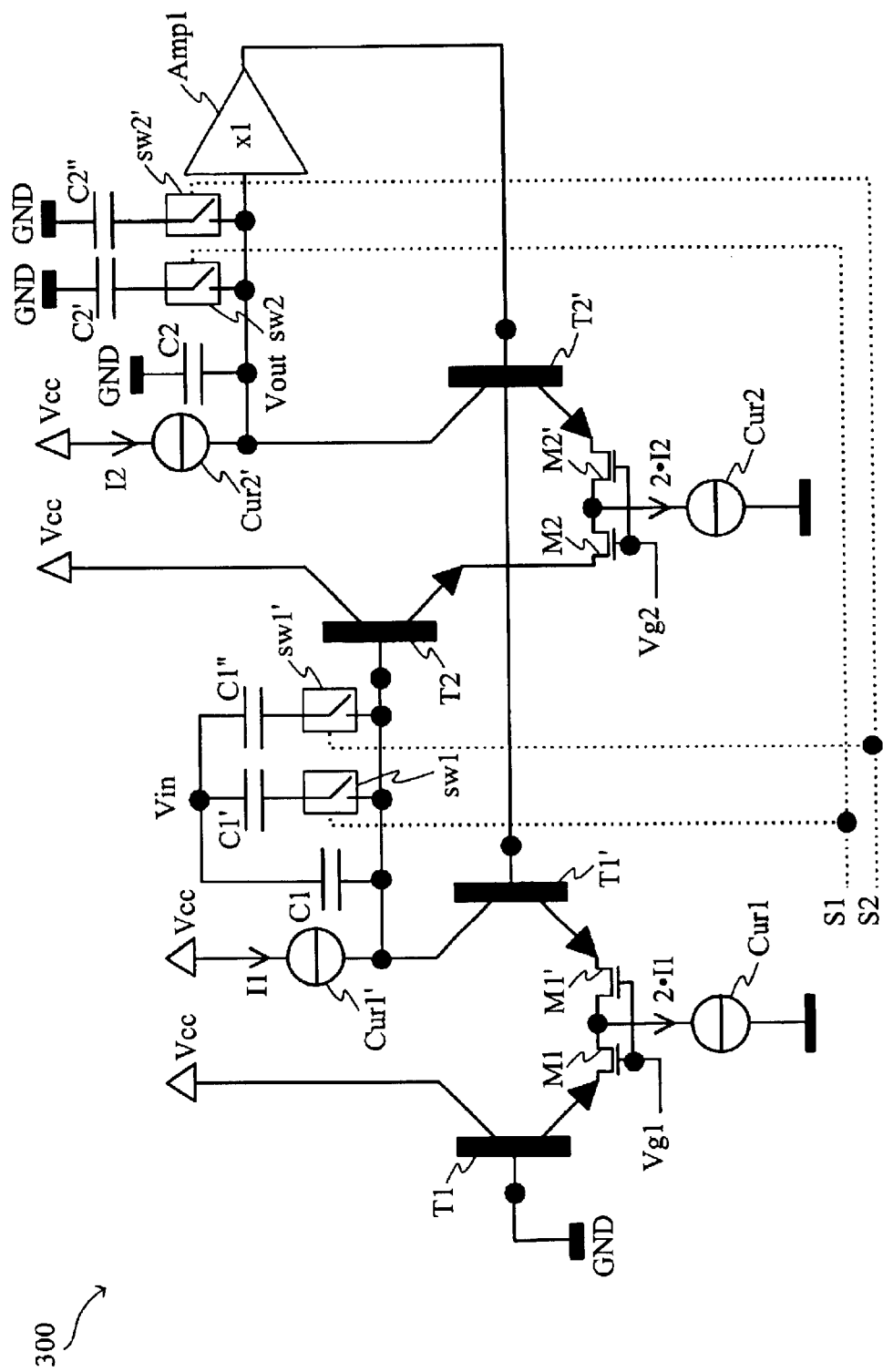
FIG. 5 is a circuit diagram of a bandpass biquad filter in a single-ended topology according to an alternate embodiment of the present invention.
Figure 6:
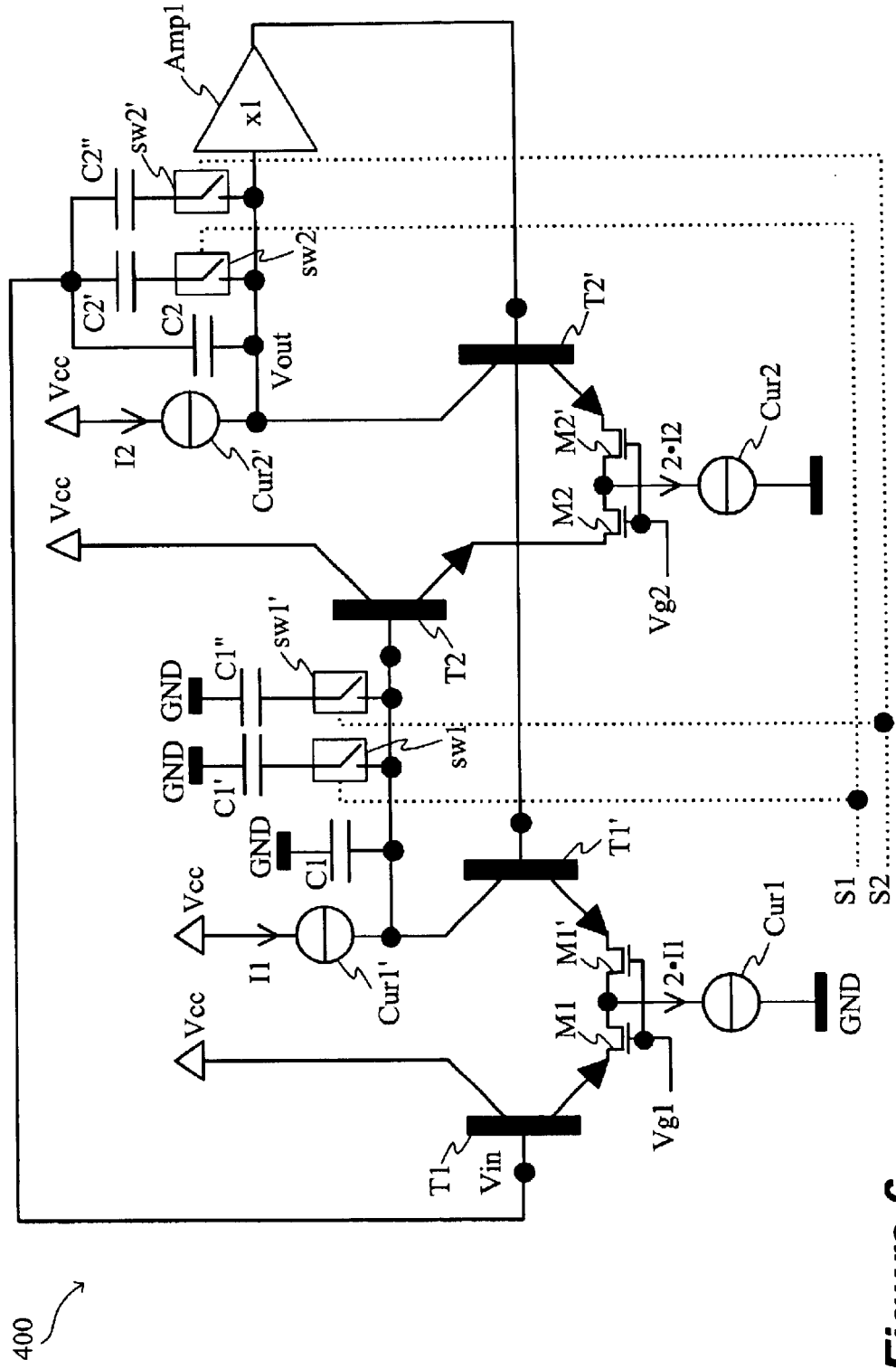
FIG. 6 is a circuit diagram of a bandstop biquad filter in a single-ended topology according to an alternate embodiment of the present invention.

As mentioned above, in order for a TV tuner to receive input RF signals in the low VHF, VHF and UHF bands, the RF input circuit of the TV tuner needs to be capable of receiving a large input voltage range. FIGS. 5 and 6 illustrate alternate embodiments of the present invention where the biquad filter is configured to provide an extended input voltage range for receiving input RF signals in all of the relevant frequency bands. When the biquad filter having extended input voltage range is incorporated in a tuner for receiving television signals, the tuning performance of the tuner can be significantly improved.

FIG. 5 is a circuit diagram of a biquad filter configured as a bandpass filter in a single-ended topology according to an alternate embodiment of the present invention. Like elements in FIG. 5 and FIG. 3 are given like reference numerals to simplify the discussion.

Referring to FIG. 5, bandpass filter 300 includes two emitter-coupled pairs coupled in an analogous manner as the emitter-coupled pairs in bandpass filter 100 of FIG. 3. The first emitter-coupled pair includes bipolar transistors T1 and T1'. The collector terminal of transistor T1 is connected to the power supply voltage Vcc and the collector terminal of transistor T1' is connected to a current source Cur1', delivering a current of value I1. The base terminal of transistor T1 is connected to an analogue ground voltage. In the present embodiment, the emitter terminals of transistors T1 and T1' are connected together through two MOS transistors M1 and M1' which are biased in the triode region. The common node of transistors M1 and M1' is connected to a current source Cur1, delivering a current equal to 2•I1. The gate terminals of transistors M1 and M1' are connected to a control signal Vg1 which causes transistors M1 and M1' to be always turned on.

The second emitter-coupled pair is made up of bipolar transistors T2 and T2'. The collector terminal of transistor T2 is connected to the power supply voltage Vcc and the collector terminal of transistor T2' is connected to a current source Cur2', delivering a current of value I2. The emitter terminals of transistors T2 and T2' are connected together through two MOS transistors M2 and M2' which are biased in the triode region. The common node of transistors M2 and M2' is connected to a current source Cur2, delivering a current equal to 2•. The gate terminals of transistors M2 and M2' are connected to a control signal Vg2 which causes transistors M2 and M2' to be always turned on.

Turning to the RF input circuit portion of bandpass filter 300, the base terminal of transistor T2 is connected to the collector terminal of transistor T1' and is also connected to a capacitor C1. The other plate of capacitor C1 is coupled to receive the input RF signal Vin. In the present embodiment, bandpass filter 300 includes a switching circuit for realizing coarse tuning by discrete frequency steps. The switching circuit including a bank of capacitors is switchably connected in parallel across capacitor C1. Specifically, in the embodiment shown in FIG. 5, capacitors C1' and C1" are connected in parallel between the input signal Vin and the base terminal of transistor T2 through the action of switches sw1 and sw1', respectively. Switch sw1 is controlled by a control signal S1 and switch sw1' is controlled by a control signal S2.

In the embodiment shown in FIG. 5, the coarse switching circuit in bandpass filter 300 includes a bank of two capacitors and two switches. This configuration is illustrative only and in other embodiment, the coarse switching circuit can be provided with one or more capacitors and the corresponding one or more switches to provide the desired capacitance values to realize the coarse switching function. Furthermore, each capacitor in the bank of capacitors can have different capacitance values to realize the desired capacitance values, as will be seen in the equations below.

Turning to the output circuit portion of bandpass filter 300, the collector terminal of transistor T2' is connected to a capacitor C2 which also provides the output signal Vout. The other plate of capacitor C2 is connected to the ground (GND) voltage. In the present embodiment, a bank of capacitors is switchably connected in parallel across capacitor C2. In the present embodiment, capacitors C2' and C2" are connected between the ground voltage and the output signal Vout through the action of switches sw2 and sw2', respectively. Switch sw2 is controlled by the control signal S1 and switch sw2' is controlled by a control signal S2. In the present embodiment, the bank of capacitors includes two capacitors with two corresponding switches. In other embodiments, the bank of capacitors can include one or more capacitors with the corresponding one or more switches.

Finally, an amplifier Amp1 having a gain 1 is coupled across the collector terminal and the base terminal of transistor T2'. The base terminals of transistor T1' and T2' are connected together. As described above, amplifier Amp1 is optional and is required only when the filter circuit is interconnected with other circuit blocks.

Because MOS transistors M1 and M1', M2 and M2' are biased in the triode region, the transistors act like resistors. In the present embodiment, transistors M1 and M1' are equally sized transistors and transistors M2 and M2' are equally sized transistors. Each of transistors M1 and M1' has a resistance value Re1 while each of transistors M2 and M2' have a resistance value of Re2 given as follows:

$$Re1 = \frac{k1}{(Vg1 - V_T)} \text{ and } Vg1 > V_T; \text{ and}$$

$$Re2 = \frac{k2}{(Vg2 - V_T)} \text{ and } Vg2 > V_T$$

where k1 is a constant depending on the technology and the geometry of transistors M1 and M1' and k2 is a constant depending on the technology and the geometry of transistors M2 and M2', Vg1 is the control voltage on the gate terminals of transistors M1 and M1', Vg2 is the control voltage on the gate terminals of transistors M2 and M2', and $V_T$ is the threshold voltage of transistors.

Introducing resistance Re1 and Re2 at the emitter terminals (emitter resistance) of the emitter-coupled pairs causes emitter degeneration which has the effect of extending the input voltage range of the emitter-coupled pairs. In the present embodiment, MOS transistors are used as a variable resistive elements to introduce the desired amount of emitter resistance. In other embodiments, other variable resistive elements, such as a variable resistor, can be used for introducing the resistance Re1 and Re2.

The relationship between the output signal Vout and the input RF signal Vin (the "transfer function") is given as follows:

$$H(s) = \frac{Vout}{Vin} = \frac{s \cdot \omega 2}{s^2 + s \cdot \omega 2 + \omega 1 \cdot \omega 2}, \text{ where}$$

$$\omega 1 = \frac{1}{2 \cdot (U_T/I1 + Re1) \cdot Ct1} \text{ and}$$

$$\omega 2 = \frac{1}{2 \cdot (U_T/I2 + Re2) \cdot Ct2},$$

where Ct1 is the total capacitance at the collector terminal of transistor T1', Ct2 is the total capacitance at the collector terminal of transistor T2', $U_T$ is the thermodynamic potential approximately equal to 26 mV at 300° K., s is the Laplace variable and equals to jω for a pure sine wave signal.

The center frequency ($f_0$) of bandpass filter 300 and the 3-dB bandwidth (B) are given by the following equations:

$$f_0 = \frac{\sqrt{\omega 1 \cdot \omega 2}}{2 \cdot \pi} \text{ (in Hz)}$$

$$B = \frac{\omega 2}{2 \cdot \pi} \text{ (in Hz)}$$

The above equations show that the center frequency and the 3-dB bandwidth of bandpass filter 300 are tunable by the currents I1 and I2 as well as the control signals Vg1 and Vg2. Specifically, control voltages Vg1 and Vg2 provide "fine tuning" capability in bandpass filter 300.

Coarse turning operation in bandpass filter 300 for switching between frequency bands is effectuated by signals S1 and S2 which control the switches associated with the bank of capacitors. Specifically, under the control of signals S1 and S2, switches sw1, sw1', sw2 and sw2' perform frequency band switching between the several frequency bands in interest, such as low-VHF, mid/high-VHF and UHF. The total capacitance Ct1 at the collector terminal of transistor T1' and the total capacitance Ct2 at the collector terminal of transistor T2' are equal to:

$Ct1 = C1 + sw1 \cdot C1' + sw1' \cdot C1''$; and $Ct2 = C2 + sw2 \cdot C2' + sw2' \cdot C2''$, where sw1 and sw1' in the above equations denote the logical value "0" or "1" of switches sw1 and sw1', and sw2 and sw2' denote the logical value "0" or "1" of switches sw2 and sw2'. For example, a logical value of "1" represents a closed switch and a logical value of "0" represents an open switch. By selecting the desired total capacitance Ct1 and Ct2 through switches sw1, sw1', sw2 and sw2', "coarse tuning" of bandpass filter 300 is effectuated.

FIG. 6 is a circuit diagram of a biquad filter configured as a bandstop filter in a single-ended topology according to an alternate embodiment of the present invention. Like elements in FIGS. 5 and 6 are given like reference numerals to simplify the discussion. Referring to FIG. 6, bandstop filter 400 is constructed using the basic biquad filter circuit of the present invention but with the input RF signal coupled to different input nodes of the biquad filter circuit to realize the desired trap or notch filter function. Thus, bandpass filter 300 and bandstop filter 400 illustrate the adaptability of the basic biquad filter circuit of the present invention to provide the desired filter shapes.

Bandstop filter 400 of FIG. 6 includes two emitter-coupled pairs coupled in the same manner as bandpass filter 300 of FIG. 5. Referring to FIG. 6, the first emitter-coupled pair is made up of bipolar transistors T1 and T1'. The collector terminal of transistor T1 is connected to the power supply Vcc and the collector terminal of transistor T1' is connected to a current source Cur1', delivering a current of value I1. The emitter terminals of transistors T1 and T1' are connected together through two MOS transistors M1 and M1' which are biased in the triode region. The common node between transistors M1 and M1' is connected to a current source Cur1, delivering a current equal to 2•I1. The gate terminals of MOS transistors M1 and M1' are connected to a control signal Vg1 which causes transistors M1 and M1' to be always turned on. The input RF signal Vin is connected to the base terminal of transistor T1.

The second emitter-coupled pair is made up of bipolar transistors T2 and T2'. The collector terminal of transistor T2 is connected to the power supply voltage Vcc and the collector terminal of transistor T2' is connected to a current source Cur2', delivering a current of value . The emitter terminals of transistors T2 and T2' are connected together through two MOS transistors M2 and M2' which are biased in the triode region. The common node of transistors M2 and M2' is connected to a current source Cur2, delivering a current equal to 2•. The gate terminals of MOS transistors M2 and M2' are connected to a control signal Vg2 which causes transistors M2 and M2' to be always turned on.

The base terminal of transistor T2 is connected to the collector terminal of transistor T1' and is also connected to a capacitor C1. The other plate of capacitor C1 is connected to the ground (GND) voltage. In the present embodiment, a bank of capacitors is switchably connected in parallel across capacitor C1. Specifically, in the embodiment shown in FIG. 6, capacitors C1' and C1" are connected between the ground voltage and the base terminal of transistor T2 through the action of switches sw1 and sw1', respectively. Switch sw1 is controlled by a control signal S1 and switch sw1' is controlled by a control signal S2.

At the output node of bandstop filter 400, the collector terminal of transistor T2' is connected to a capacitor C2 which also provides the output signal Vout. The other plate of capacitor C2 is connected to the input signal Vin. In the present embodiment, a bank of capacitors is switchably connected in parallel across capacitor C2. In the present embodiment, capacitors C2' and C2" are connected between the input signal Vin and the output signal Vout through the action of switches sw2 and sw2', respectively. Switch sw2 is controlled by the control signal S1 and switch sw2' is controlled by a control signal S2.

Finally, an amplifier Amp1 having a gain 1 is coupled across the collector terminal and the base terminal of transistor T2'. The base terminals of transistor T1' and T2' are connected together. As described above, amplifier Amp1 is optional, but inclusion of the amplifier achieves advantageously a low impedance at the filter output.

Because MOS transistors M1 and M1', M2 and M2' are biased in the triode region, the transistors act like resistors. In the present embodiment, transistors M1 and M1' are equally sized transistors and transistors M2 and M2' are equally sized transistors. Transistors M1 and M1' have a resistance value Re1 while transistors M2 and M2' have a resistance value of Re2 which in the first approximation are given by:

$$Re1 = \frac{k1}{(Vg1 - V_T)} \text{ and } Vg1 > V_T; \text{ and}$$

$$Re2 = \frac{k2}{(Vg2 - V_T)} \text{ and } Vg2 > V_T$$

where k1 is a constant depending on the technology and the geometry of transistors M1 and M1' and k2 is a constant depending on the technology and the geometry of transistors M2 and M2', Vg1 is the control voltage on the gate terminals of transistors M1 and M1', Vg2 is the control voltage on the gate terminals of transistors M2 and M2', $V_T$ is the threshold voltage of the transistors.

Introducing resistance Re1 and Re2 at the emitter terminals (emitter resistance) of the emitter-coupled pairs causes emitter degeneration which has the effect of extending the input voltage range of the emitter-coupled pairs.

The relationship between the output signal Vout and the input RF signal Vin (the "transfer function") of bandstop filter 400 is given as follows:

$$H(s) = \frac{Vout}{Vin} = \frac{s^2 + \omega1 \cdot \omega2}{s^2 + s \cdot \omega2 + \omega1 \cdot \omega2}, \text{ where}$$

$$\omega1 = \frac{1}{2 \cdot (U_T/I1 + Re1) \cdot Ct1}; \text{ and}$$

$$\omega2 = \frac{1}{2 \cdot (U_T/I2 + Re2) \cdot Ct2}$$

where Ct1 is the total capacitance at the collector terminal of transistor T1', Ct2 is the total capacitance at the collector terminal of transistor T2', $U_T$ is the thermodynamic potential approximately equal to 26 mV at 300° K., s is the Laplace variable and equals to jω for a pure sine wave signal.

The center frequency ($f_0$) of bandstop filter 400 and the 3-dB bandwidth (B) are given by the following equations:

$$f_0 = \frac{\sqrt{\omega1 \cdot \omega2}}{2 \cdot \pi} \text{ (in Hz)}$$

$$B = \frac{\omega2}{2 \cdot \pi} \text{ (in Hz)}$$

The above equations show that the center frequency and the 3-dB bandwidth of bandstop filter 400 are tunable by the currents I1 and I2 as well as the control signals Vg1 and Vg2. Specifically, control voltages Vg1 and Vg2 provide "fine tuning" capability in bandstop filter 400.

Under the control of signals S1 and S2, switches sw1, sw1', sw2 and sw2' perform frequency switching between the several frequency bands in interest, such as low-VHF, mid/high-VHF and UHF. The total capacitance Ct1 at the collector terminal of transistor T1' and the total capacitance Ct2 at the collector terminal of transistor T2' are equal to:

$$Ct1=C1+sw1 \cdot C1'+sw1' \cdot C1''; \text{ and}$$

$$Ct2=C2+sw2 \cdot C2'+sw2' \cdot C2'',$$

where sw1 and sw1' in the above equations denote the logical value "0" or "1" of switches sw1 and sw1', and sw2 and sw2' denote the logical value "0" or "1" of switches sw2 and sw2'. For example, a logical value of "1" represents a closed switch and a logical value of "0" represents an open switch. By selecting the desired total capacitance Ct1 and Ct2 through switches sw1, sw1', sw2 and sw2', "coarse tuning" of bandstop filter 400 is effectuated.

Figure 7:
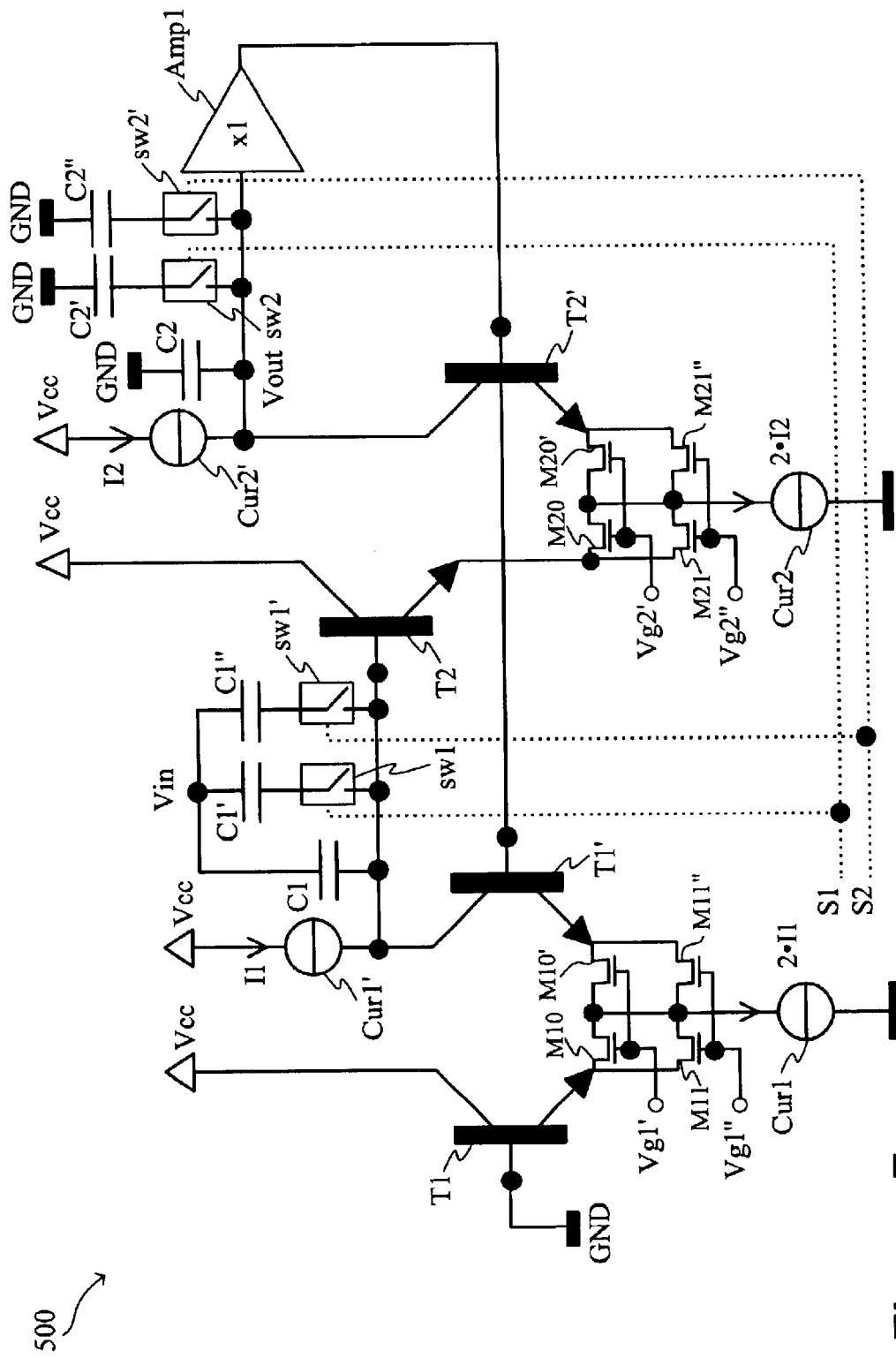
FIG. 7 is a circuit diagram of a bandpass biquad filter in a single-ended topology according to a second alternate embodiment of the present invention.

FIG. 7 is a circuit diagram of a bandpass biquad filter in a single-ended topology according to a second alternate embodiment of the present invention. Bandpass biquad filter 500 of FIG. 7 is constructed in an analogous manner as bandpass biquad filter 300 of FIG. 5. Like elements in FIGS. 5 and 7 are given like reference numerals and will not be further described. Referring to FIG. 7, bandpass filter 500 includes two emitter-coupled pairs coupled in an analogous manner as the emitter-coupled pairs in bandpass filter 300 of FIG. 5. However, in the present embodiment, the emitter terminals of each emitter-coupled pair are coupled together through a bank of transistor pairs. Specifically, in the present embodiment, the emitter terminals of each emitter-coupled pair are connected together through a bank of two pairs of MOS transistors. The total resistive load on the emitter terminals of the emitter-coupled pair is given by the parallel resistance of the bank of MOS transistor pairs.

With respect to the first emitter-coupled pair, a first pair of MOS transistors M10 and M10' is connected in series between the emitter terminals of transistors T1 and T1'. The common node of transistors M10 and M10' is connected to current source Cur1. The gate terminals of transistors M10 and M10' are connected to a control signal Vg1'. A second pair of MOS transistors M11 and M11' is connected in parallel to the first pair of MOS transistors M10 and M10'. The common node of transistors M11 and M11' is also connected to current source Cur1. The gate terminals of transistors M11 and M11' are connected to a control signal Vg1".

With respect to the second emitter-coupled pair, a first pair of MOS transistors M20 and M20' is connected in series between the emitter terminals of transistors T2 and T2'. The common node of transistors M20 and M20' is connected to current source Cur2. The gate terminals of transistors M20 and M20' are connected to a control signal Vg2'. A second pair of MOS transistors M21 and M21' is connected in parallel to the first pair of MOS transistors M20 and M20'. The common node of transistors M21 and M21' is also connected to current source Cur2. The gate terminals of transistors M21 and M21' are connected to a control signal Vg2".

The inclusion of a bank of transistor pairs in the emitter-coupled pairs of bandpass filter 500 realizes a coarse tuning system whereby coarse frequency tuning control is effectuated by switching of resistance in addition to switching of capacitance. Specifically, coarse tuning in bandpass filter 500 is realized by switchably connecting capacitors C1' and C1" and capacitors C2' and C2" to the input voltage node and the output voltage node, respectively. Coarse tuning is also realized by turning on or off selective transistor pairs in the emitter-coupled pairs to obtain a stepwise increase or decrease in the resistive load at the emitter terminals of the emitter-coupled pairs. When an MOS transistor is turned off, the electrical connection is effectively an open circuit, providing a very high resistance. On the other hand, when an MOS transistor is turned on, the on-resistance of the MOS transistor is very small, representing a significant contrast to the off-resistance of the transistor.

Thus, the bank of transistor pairs incorporated in the emitter-coupled pairs of bandpass filter 500 in effect acts as switches and as variable resistance devices. For the purpose of providing coarse tuning, the control signal driving the gate terminal of the transistors causes each transistor pair to turn on or off, thereby introducing discrete stepwise variations in resistance. For the purpose of providing fine tuning, the control signal delivers a gate voltage that biases the transistors in the triode region. The gate voltage of each transistor pair is adjusted precisely, thereby introducing precise but finite variations in resistance. Specifically, for fine frequency tuning, the on-resistance of the MOS transistors can be continuously modulated by adjusting the gate voltage. As a result, the resistive load at the emitter terminals of the emitter-coupled pair can be precisely adjusted to the desired resistance value so as to provide accurate control of the frequency operation of the bandpass filter.

In the present embodiment, each pair of transistors M10 and M10', M11 and M11', M20 and M20', and M21 and M21' includes identical transistors. If the gate voltage is higher than the threshold voltage, the resistance values of each transistor pair is given in first approximation by:

$$Re10 = k1' \cdot (Vg1' - V_T)^{-1};$$

$$Re11 = k1'' \cdot (Vg1'' - V_T)^{-1};$$

$$Re20 = k2' \cdot (Vg2' - V_T)^{-1}; \text{ and}$$

$$Re21 = k2'' \cdot (Vg2'' - V_T)^{-1}$$

where Re10 is the resistance value of transistor pair M10 and M10', Re11 is the resistance value of transistor pair M11 and M11', Re20 is the resistance value of transistor pair M20 and M20', and R21 is the resistance value of transistor pair M21 and M21'. Furthermore, k1', k1" are constants depending on the technology and the geometry of transistor pairs M10/M10' and M11/M11', and k2', k2" are constants depending on the technology and the geometry of transistor pairs M20/M20' and M21/M21'. Vg1' and Vg1" are control voltages for transistors pairs M10/M10' and M11/M11', respectively. Vg2' and Vg2" are the control voltages for transistor pairs M20/M20' and M21/M21', respectively. Finally, $V_T$ is the threshold voltage of the transistors.

The total equivalent resistance for coarse frequency tuning is the parallel resistance of the MOS transistors that are in the "on" mode (that is, for Vgi>$V_T$, where i is 1 or 2) and the total equivalent resistance is given by:

$$\frac{1}{Re1_{TOT}} = \frac{1}{Re10} + \frac{1}{Re11},$$

where $Re10 = k1' \cdot (Vg1' - V_T)^{-1}$ and $Re11 = k1'' \cdot (Vg1'' - V_T)^{-1}$; and $$\frac{1}{Re2_{TOT}} = \frac{1}{Re20} + \frac{1}{Re21},$$

where $Re20 = k2' \cdot (Vg2' - V_T)^{-1}$ and $Re21 = k2'' \cdot (Vg2'' - V_T)$ where $Re1_{TOT}$ is the total equivalent resistance of the first emitter-coupled pair (transistors T1 and T1'), $Re2_{TOT}$ is the total equivalent resistance of the second emitter-coupled pair (transistors T2 and T2'), and.

Each of the emitter-coupled pairs in bandpass filter 500 of FIG. 7 includes a bank of two transistor pairs. However, this is illustrative only and in other embodiments, each emitter-coupled pair may incorporate a bank of two or more transistor pairs. For example, in one embodiment, a bank of four transistor pairs is included at each emitter-coupled pair of the bandpass filter. Moreover, when a bank of transistor pairs is incorporated in the emitter-coupled pair, all but one of the transistor pairs in the bank can be turned off completely to provide step-wise variations in resistance. In such case, one transistor pair is left turned on to provide electrical connection between the emitter terminals of the emitter-coupled pair.

Figure 8:
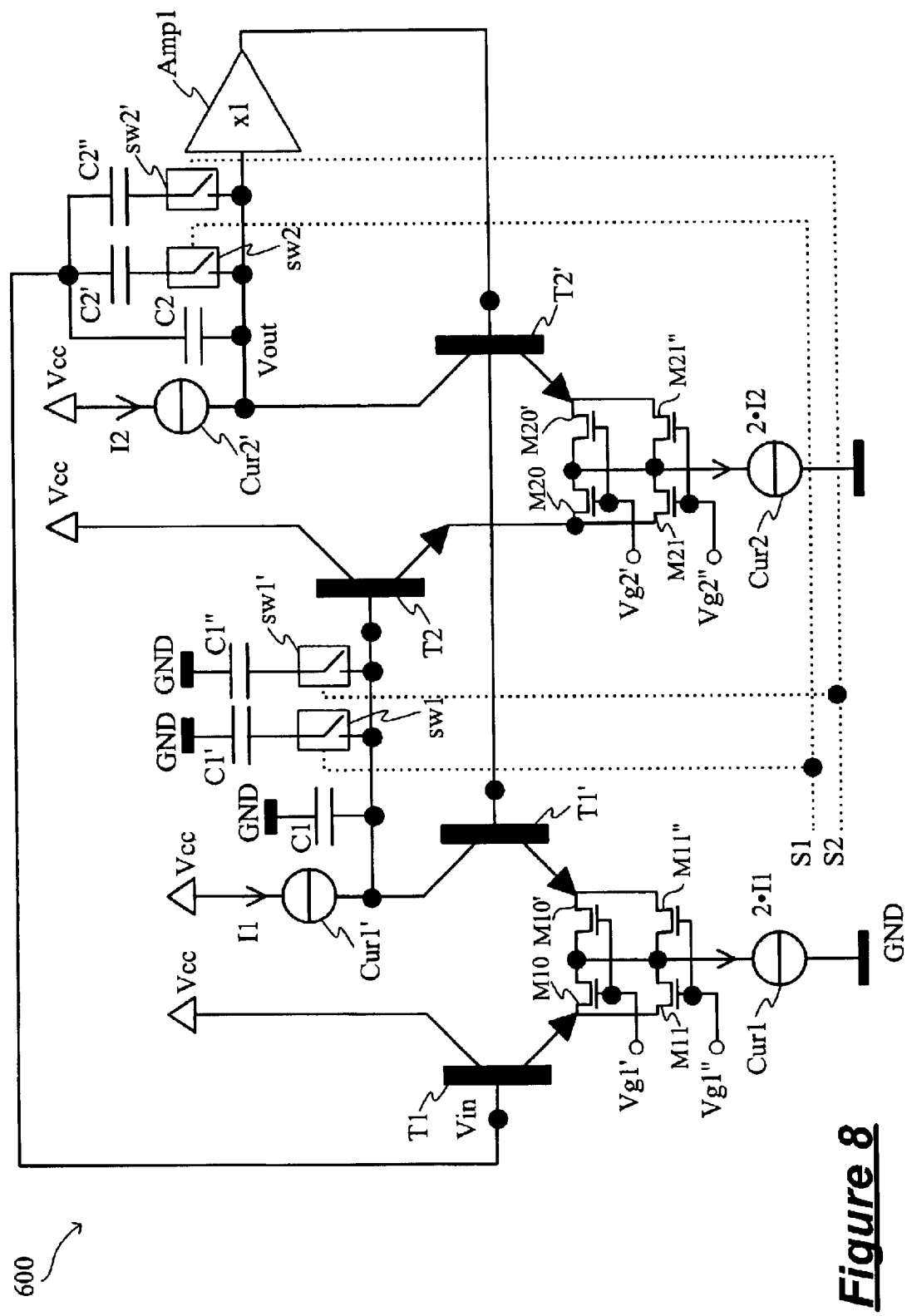
FIG. 8 is a circuit diagram of a bandstop biquad filter in a single-ended topology according to a second alternate embodiment of the present invention.

FIG. 8 is a circuit diagram of a bandstop biquad filter in a single-ended topology according to a second alternate embodiment of the present invention. Bandstop biquad filter 600 of FIG. 8 is constructed in an analogous manner as bandstop biquad filter 400 of FIG. 6. Like elements in FIGS. 6 and 8 are given like reference numerals and will not be further described. Referring to FIG. 8, bandstop filter 600 includes two emitter-coupled pairs coupled in an analogous manner as the emitter-coupled pairs in bandstop filter 400 of FIG. 6. However, in the present embodiment, the emitter terminals of each emitter-coupled pair are coupled together through a bank of transistor pairs, in the same manner as in bandpass filter 500 of FIG. 7. In the present embodiment, the emitter terminals of each emitter-coupled pair are connected together through a bank of two pairs of MOS transistors. The total resistive load on the emitter terminals of the emitter-coupled pair is given by the parallel resistance of the bank of MOS transistor pairs.

The structure and operation of the banks of transistor pairs in the emitter-coupled pairs of bandstop filter 600 are the same as that of bandpass filter 500 of FIG. 7 and will not be further described. The inclusion of the bank of transistor pairs in the emitter-coupled pairs of bandstop filter 600 has the same effect as in the case of bandpass filter 500 of FIG. 7. That is, the bank of transistor pairs provides both coarse frequency tuning control as well as fine frequency tuning control, as described above with reference to FIG. 7.

In FIG. 8, each bank of transistor pairs includes two transistor pairs. Of course, in other embodiments, bandstop filter 600 can include two or more transistor pairs in each bank to provide the desired resistance values for coarse and fine frequency tuning.

As shown in FIGS. 3–8, the biquad filter circuit of the present invention is constructed using transistor and capacitor which circuit elements can be readily manufactured in an integrated circuit. Thus, the biquad filter circuit of the present invention can be integrated with other tuner circuitry to yield a fully integrated tuner. When a tuner for a television receiver is constructed using the biquad filter of the present invention as the RF input stage, the tuner performance in all of the frequency bands of interest can be appreciably enhanced. Furthermore, the biquad filter circuit of the present invention can be constructed to provide an extended input voltage range capability, ensuing high quality reception of input signals from all relevant frequency bands. The biquad filter of the present invention can be realized in tuners constructed for either terrestrial broadcast or cable transmission.

The above detailed descriptions are provided to illustrate specific embodiments of the present invention and are not intended to be limiting. Numerous modifications and variations within the scope of the present invention are possible. For example, the differential pairs in the biquad filter circuit can be implemented using only MOS transistors. Another possible alteration of these circuits is to combine the MOS transistors in parallel or in series with linear resistors to limit the total variability of the resistive load of the emitter node.

Furthermore, in the embodiments shown in FIGS. 5 to 8, emitter resistance is introduced to the filter circuit to boost the input voltage range and a coarse tuning system is introduced for performing frequency band switching. In other embodiments of the present invention, either emitter resistance or the coarse tuning system can be introduced to enhance the performance of the biquad filter circuit of the present invention. For example, emitter resistance can be introduced to the bandpass filter circuit of FIG. 3 to extend the input voltage range of the filter circuit. Additionally, in the embodiments shown in FIGS. 5–8, MOS transistors are used to introduce emitter resistance to the differential pair where the MOS transistors also function as switches for introducing stepwise variations in resistance. In other embodiments, the MOS transistors can be replaced by switching devices that have a variable on-resistance.

Finally, the biquad filter circuits shown in FIGS. 3–8 are illustrative only. One of ordinary skill in the art would appreciate that the basic biquad filter circuit of FIGS. 3–8 can be extended to achieve high-order filters by using a similar tuning principle, mixing simultaneously a continuous and a stepwise control of the operation frequency. The present invention is defined by the appended claims.

We claim:

1. A tunable filter circuit comprising:
   a first differential pair having a first input terminal coupled to a first node, a second input terminal coupled to a second node, and an output terminal coupled to a first current source, said first differential pair being biased by a second current source;
   a first capacitor coupled between a third node and said output terminal of said first differential pair;
   a second differential pair having a first input terminal coupled to said output terminal of said first differential pair, a second input terminal coupled to said second node, and an output terminal coupled to a third current source and providing an output voltage signal, said second differential pair being biased by a fourth current source; and
   a second capacitor coupled between said first node and said output terminal of said second differential pair.

2. The circuit of claim 1, wherein when said first node is coupled to a first supply voltage and said third node is coupled to an input voltage terminal for receiving an input voltage signal, said filter circuit functions as a bandpass filter.

3. The circuit of claim 2, wherein said first supply voltage is an analogue ground voltage.

4. The circuit of claim 2, wherein said first current source has a first current value, said second current source has a second current value twice of said first current value, said third current source has a third current value, and said fourth current source has a fourth current value twice of said third current value; and wherein said output voltage signal is tuned to a selected frequency of said input voltage signal by varying said first current value and said third current value.

5. The circuit of claim 1, wherein when said first node is coupled to an input voltage terminal for receiving an input voltage signal and said third node is coupled to a first supply voltage, said filter circuit functions as a bandstop filter.

6. The circuit of claim 5, wherein said first supply voltage is an analogue ground voltage.

7. The circuit of claim 5, wherein said first current source has a first current value, said second current source has a second current value twice of said first current value, said third current source has a third current value, and said fourth current source has a fourth current value twice of said third current value; and wherein said output voltage signal is tuned to a selected frequency of said input voltage signal by varying said first current value and said third current value.

8. The circuit of claim 1, wherein said first differential pair comprises:
   a first transistor having a first current handling terminal coupled to a second supply voltage, a second current handling terminal coupled to said second current source and a control terminal coupled to said first node; and
   a second transistor having a first current handling terminal coupled to said first current source, a second current handling terminal coupled to said second current source and a control terminal coupled to said second node.

9. The circuit of claim 8, wherein said first transistor and said second transistor comprise bipolar NPN transistors.

10. The circuit of claim 8, wherein said second supply voltage is a power supply voltage.

11. The circuit of claim 8, wherein said second current handling terminal of each of said first and second transistors is coupled to said second current source through a variable resistive element.

12. The circuit of claim 11, wherein said variable resistive element comprises a MOS transistor, said MOS transistor having a first current handling terminal coupled to said second current handling terminal of a respective one of said first and second transistors, a second current handling terminal coupled to said second current source and a control terminal receiving a control signal, said control signal biasing said MOS transistor in a triode region.

13. The circuit of claim 8, wherein said second current handling terminals of said first and second transistors are coupled to said second current source through a bank of pairs of switches having variable on-resistance, each pair of switches being coupled between said second current handling terminals of said first and second transistors and being controlled by a control signal.

14. The circuit of claim 13, wherein said bank of pair of switches having variable on-resistance comprises a plurality of MOS transistor pairs, each MOS transistor pair comprising two or more transistors connected in series between said second current handling terminal of said first transistor and said second current handling terminal of said second transistor and receiving said control signal, a common node between said two or more MOS transistors being connected to said second current source.

15. The circuit of claim 14, further comprising:
   a first plurality of capacitors each serially connected to a respective one of a first plurality of switches, each of said first plurality of serially connected capacitors and switches being connected between said third node and said output terminal of said first differential pair; and
   a second plurality of capacitors each serially connected to a respective one of a second plurality of switches, each of said second plurality of serially connected capacitors and switches being connected between said first node and said output terminal of said second differential pair;
   wherein said first and second plurality of switches are controlled by a corresponding plurality of control signals to selectively connect one or more of said first plurality of capacitors in parallel with said first capacitor and to selectively connect one or more of said second plurality of capacitors in parallel with said second capacitor.

16. The circuit of claim 15, wherein coarse tuning of said circuit is effectuated by selectively turning on one or more of said plurality of MOS transistor pairs and selectively connecting one or more of said first plurality of capacitors and said second plurality of capacitors in parallel with a respective one of said first capacitor and said second capacitor.

17. The circuit of claim 14, wherein fine tuning of said circuit is effectuated by adjusting a voltage value of said control signal controlling a respective one of said MOS transistor pairs.

18. The circuit of claim 1, wherein said second differential pair comprises:
   a first transistor having a first current handling terminal coupled to a second supply voltage, a second current handling terminal coupled to said fourth current source and a control terminal coupled to said output terminal of said first differential pair; and
   a second transistor having a first current handling terminal coupled to said third current source, a second current handling terminal coupled to said fourth current source and a control terminal coupled to said second node.

19. The circuit of claim 18, wherein said first transistor and said second transistor comprise bipolar NPN transistors.

20. The circuit of claim 18, wherein said second supply voltage is a power supply voltage.

21. The circuit of claim 18, wherein said second current handling terminal of each of said first and second transistors is coupled to said fourth current source through a variable resistive element.

22. The circuit of claim 21, wherein said variable resistive element comprises a MOS transistor, said MOS transistor having a first current handling terminal coupled to said second current handling terminal of a respective one of said first and second transistors, a second current handling terminal coupled to said fourth current source and a control terminal receiving a control signal, said control signal biasing said MOS transistor in a triode region.

23. The circuit of claim 18, wherein said second current handling terminals of said first and second transistors are coupled to said fourth current source through a bank of pairs of switches having variable on-resistance, each pair of switches being coupled between said second current handling terminals of said first and second transistors and being controlled by a control signal.

24. The circuit of claim 23, wherein said bank of pair of switches having variable on-resistance comprises a plurality of MOS transistor pairs, each MOS transistor pair comprising two or more transistors connected in series between said second current handling terminal of said first transistor and said second current handling terminal of said second transistor and receiving said control signal, a common node between said two or more MOS transistors being connected to said fourth current source.

25. The circuit of claim 24, further comprising:
   a first plurality of capacitors each serially connected to a respective one of a first plurality of switches, each of said first plurality of serially connected capacitors and switches being connected between said third node and said output terminal of said first differential pair; and
   a second plurality of capacitors each serially connected to a respective one of a second plurality of switches, each of said second plurality of serially connected capacitors and switches being connected between said first node and said output terminal of said second differential pair;
   wherein said first and second plurality of switches are controlled by a corresponding plurality of control signals to selectively connect one or more of said first plurality of capacitors in parallel with said first capacitor and to selectively connect one or more of said second plurality of capacitors in parallel with said second capacitor.

26. The circuit of claim 25, wherein coarse tuning of said circuit is effectuated by selectively turning on one or more of said plurality of MOS transistor pairs and selectively connecting one or more of said first plurality of capacitors and said second plurality of capacitors in parallel with a respective one of said first capacitor and said second capacitor.

27. The circuit of claim 24, wherein fine tuning of said circuit is effectuated by adjusting a voltage value of said control signal controlling a respective one of said MOS transistor pairs.

28. The circuit of claim 1, further comprising:
a first plurality of capacitors each serially connected to a respective one of a first plurality of switches, each of said first plurality of serially connected capacitors and switches being connected between said third node and said output terminal of said first differential pair; and
a second plurality of capacitors each serially connected to a respective one of a second plurality of switches, each of said second plurality of serially connected capacitors and switches being connected between said first node and said output terminal of said second differential pair;
wherein said first and second plurality of switches are controlled by a corresponding plurality of control signals to selectively connect one or more of said first plurality of capacitors in parallel with said first capacitor and to selectively connect one or more of said second plurality of capacitors in parallel with said second capacitor.

29. The circuit of claim 1, further comprising:
an unity gain amplifier having an input terminal coupled to said output terminal of said second differential pair and an output terminal coupled to said second node.

30. A tunable filter circuit comprising:
a first bipolar differential pair having a first input terminal coupled to a first node, a second input terminal coupled to a second node, and an output terminal coupled to a first current source, said first differential pair being biased by a second current source, wherein the emitter terminals of said first bipolar differential pair are coupled to said second current source through a first plurality of transistor pairs, each transistor pair having a common node coupled to said second current source and controlled by a control signal;
a first capacitor coupled between a third node and said output terminal of said first differential pair;
a second bipolar differential pair having a first input terminal coupled to said output terminal of said first differential pair, a second input terminal coupled to said second node, and an output terminal coupled to a third current source and providing an output voltage signal, said second differential pair being biased by a fourth current source, wherein the emitter terminals of said second bipolar differential pair are coupled to said fourth current source through a second plurality of transistor pairs, each transistor pair having a common node coupled to said fourth current source and controlled by a control signal; and
a second capacitor coupled between said first node and said output terminal of said second differential pair;
wherein coarse tuning of said filter circuit is effectuated by selectively turning on said one or more transistor pairs in said first and second plurality of MOS transistor pairs.

31. The circuit of claim 30, wherein when said first node is coupled to a first supply voltage and said third node is coupled to an input voltage terminal for receiving an input voltage signal, said filter circuit functions as a bandpass filter.

32. The circuit of claim 31, wherein said first supply voltage is an analogue ground voltage.

33. The circuit of claim 30, wherein when said first node is coupled to an input voltage terminal for receiving an input voltage signal and said third node is coupled to a first supply voltage, said filter circuit functions as a bandstop filter.

34. The circuit of claim 33, wherein said first supply voltage is an analogue ground voltage.

35. The circuit of claim 30, wherein said first differential pair comprises:
a first bipolar NPN transistor having a first current handling terminal coupled to a second supply voltage, a second current handling terminal coupled to said second current source through said first plurality of transistor pairs, and a control terminal coupled to said first node; and
a second bipolar NPN transistor having a first current handling terminal coupled to said first current source, a second current handling terminal coupled to said second current source through said first plurality of transistor pairs, and a control terminal coupled to said second node.

36. The circuit of claim 35, wherein said second supply voltage is a power supply voltage.

37. The circuit of claim 35, wherein said first plurality of transistors pairs comprises pairs of MOS transistors connected in parallel between said second current handling terminals of said first bipolar NPN transistor and said second bipolar NPN transistor, each pair of MOS transistors comprising two or more MOS transistors connected in series and receiving a common control signal, a common node between each pair of MOS transistors being connected to said second current source.

38. The circuit of claim 30, wherein said second differential pair comprises:
a first bipolar NPN transistor having a first current handling terminal coupled to a second supply voltage, a second current handling terminal coupled to said fourth current source through said second plurality of transistor pairs, and a control terminal coupled to said output terminal of said first differential pair; and
a second bipolar NPN transistor having a first current handling terminal coupled to said third current source, a second current handling terminal coupled to said fourth current source through said second plurality of transistor pairs, and a control terminal coupled to said second node.

39. The circuit of claim 38, wherein said second supply voltage is a power supply voltage.

40. The circuit of claim 38, wherein said second plurality of transistors pairs comprises pairs of MOS transistors connected in parallel between said second current handling terminals of said first bipolar NPN transistor and said second bipolar NPN transistor, each pair of MOS transistors comprising two or more MOS transistors connected in series and receiving a common control signal, a common node between each pair of MOS transistors being connected to said fourth current source.

* * * * *